United States Patent
Ishida et al.

(10) Patent No.: US 7,313,496 B2
(45) Date of Patent: Dec. 25, 2007

(54) TEST APPARATUS AND TEST METHOD FOR TESTING A DEVICE UNDER TEST

(75) Inventors: Masahiro Ishida, Tokyo (JP); Takahiro Yamaguchi, Tokyo (JP); Mani Soma, Seattle, WA (US)

(73) Assignee: Advantest Corporation, Tokyo (JP)

( * ) Notice: Subject to any disclaimer, the term of this patent is extended or adjusted under 35 U.S.C. 154(b) by 51 days.

(21) Appl. No.: 11/056,330

(22) Filed: Feb. 11, 2005

(65) Prior Publication Data

US 2006/0184332 A1    Aug. 17, 2006

(51) Int. Cl.
*G01D 3/00* (2006.01)
*G01R 27/28* (2006.01)

(52) U.S. Cl. .................... 702/111; 702/120
(58) Field of Classification Search ............ 702/111
See application file for complete search history.

(56) References Cited

U.S. PATENT DOCUMENTS

| | | | |
|---|---|---|---|
| 6,100,815 A * | 8/2000 | Pailthorp | 324/754 |
| 6,173,427 B1 * | 1/2001 | Tsukagoshi | 714/724 |
| 6,961,745 B2 | 11/2005 | Laquai et al. | |
| 7,010,444 B2 * | 3/2006 | Nishikobara et al. | 702/69 |
| 2002/0174159 A1 * | 11/2002 | Laquai | 708/819 |
| 2003/0156545 A1 * | 8/2003 | Shimanouchi et al. | 370/241 |
| 2005/0031029 A1 * | 2/2005 | Yamaguchi et al. | 375/226 |
| 2005/0172181 A1 * | 8/2005 | Huliehel | 714/724 |

FOREIGN PATENT DOCUMENTS

| | | |
|---|---|---|
| EP | 1464970 | 10/2004 |
| WO | WO-03/071297 | 8/2003 |

OTHER PUBLICATIONS

Laquai, Bernd, Cai, Yi, "Testing Gigabit Multilane SerDes Interfaces with Passive Jitter Injection Filters," Oct. 30-Nov. 1, 2001, Test Conference, 2001, Proceedings, International, pp. 297-304.*
"New Paradigm for Signal Paths in ATE Electronics are Needed for Serialcom Device Testing," ITC International Test Conference, pp. 903 to 912, by Masashi Shimanouchi (referred to in the specification, paragraph [0003]), 10 pages.

* cited by examiner

*Primary Examiner*—John Barlow
*Assistant Examiner*—Lisa Sievers
(74) *Attorney, Agent, or Firm*—Osha•Liang LLP

(57) ABSTRACT

A testing apparatus for testing a device under test (DUT) includes a performance board; a main frame for generating a test signal for testing the DUT and determining pass/fail of the DUT based on an output signal output by the DUT; a pin electronics between the main frame and the performance board and performs sending and receiving signals between the main frame and the DUT; a deterministic jitter injecting unit for receiving the output signal without passing through the pin electronics and inputting a loop signal, which is the received output signal into which a deterministic jitter is injected, to an input pin of the DUT without passing through the pin electronics; and a switching unit for determining whether the input pin of the DUT is provided with the test signal output by the pin electronics or the loop signal output by the deterministic jitter injecting unit.

21 Claims, 17 Drawing Sheets

| TIMING JITTER | MEASURED [UI] | CALCULATED [UI] |
|---|---|---|
| RMS VALUE | 0.0305 | 0.0299 (-2.05%) |
| PEAK-TO-PEAK VALUE (114, 145 EVENTS) | 0.1960 | 0.1948 (-0.61%) |

FIG. 15

TEST APPARATUS AND TEST METHOD FOR TESTING A DEVICE UNDER TEST

BACKGROUND OF THE INVENTION

1. Field of the Invention

The present invention relates to a testing apparatus and a testing method for determining pass/fail of a device under test ("DUT"). More particularly, the present invention relates to a testing apparatus and a testing method for performing a test on a device such as a serial communication device or a serial I/O device with a loop-back configuration.

2. Description of the Related Art

Conventionally, a loop-back testing method using so-called ATE (Automatic Test Equipment) system is known. The loop-back testing is a testing for injecting a jitter into an output signal of a DUT and inputting the signal to an input pin of the DUT by feedback.

For example, M. Shimanouchi proposes a loop-back testing method using the configuration shown in FIG. 17 (M. Shimanouchi, "New Paradigm for Signal Paths in ATE Electronics are Needed for Serialcom Device Testing", ITC Proceedings, pp. 903–912, 2002).

According to the method, a loop-back testing is performed via a pin electronics 420 for connecting a tester main frame 410 and a DUT 200. The pin electronics 420 includes a plurality of pin cards including a driver 422, a comparator 424, and a selecting circuit 426. The method performs the loop-back testing by using four (4) pin cards.

Each of the four pin cards is connected to an input terminal Rx and an output terminal Tx of the DUT 200, and an input terminal and an output terminal of a deterministic jitter injecting unit 430. The deterministic jitter injecting unit 430 is a circuit which includes a cable for injecting a data dependent jitter (a deterministic jitter) and the like and injects the deterministic jitter into a received signal.

The comparator 424-4 of the pin card connected to the output terminal Tx of the DUT 200 receives an output signal from the output terminal Tx. Then, the selecting circuit 426-3 of the pin card connected to the input terminal of the deterministic jitter injecting unit 430 selects the output signal output by the comparator 424-4 and provides the corresponding driver 422-3 with the output signal. The driver 422-3 provides the deterministic jitter injecting unit 430 with the received output signal and the deterministic jitter injecting unit 430 injects a deterministic jitter into the output signal. The output signal into which the deterministic jitter is injected is input to the input terminal Rx of the DUT 200 by feedback via the comparator 424-2, the selecting circuit 426-1, and the driver 422-1. By this configuration, the loop-back testing is performed.

Further, B. Laquai etc. propose a loop-back testing method based on a passive filter technology (US2002/0174159A1)

However, the testing method shown in FIG. 17 inputs the output signal of the DUT 200 by feedback via the driver 422 of the pin electronics 420, the comparator 424, etc. Thus, the number of circuit components through which the feedback signal passes increases and it is impossible to perform accurately a testing on the DUT 200 with a high data rate. Further, since it is required to provide the cable for injecting the deterministic jitter and the like on a performance board on which an arrangement area of the circuit components is limited, it is hard to perform a testing on a multi-lane device including signal paths arranged in a row of several tens to several hundreds. Further, since four pin cards are used per one lane, there is a problem that a great number of pin cards are required in case of performing a loop-back testing on a DUT 200 with multi-lane.

Further, according to the B. Laquai's method, a second-order filter is used to generate the deterministic jitter. However, in case of using the second-order filter, the timing of a signal is delayed and the amplitude level of the signal is reduced due to an attenuation term of a response characteristic of the second-order filter. Thus, performing the loop-back testing by injecting deterministic jitter using this method makes a jitter tolerance estimate of the DUT being underestimated.

SUMMARY OF THE INVENTION

Therefore, it is an object of the present invention to provide a testing apparatus and a testing method, which are capable of overcoming the above drawbacks accompanying the conventional art and performing a testing on a DUT with a high-speed and multi-lane serial interface. The above and other objects can be achieved by combinations described in the independent claims. The dependent claims define further advantageous and exemplary combinations of the present invention.

According to the first aspect of the present invention, a testing apparatus for performing a testing on a device under test (DUT) includes a performance board on which the DUT is mounted; a main frame for generating a test signal for testing the DUT and determining pass/fail of the DUT on the basis of an output signal output by the DUT; a pin electronics which is provided between the main frame and the performance board and performs sending and receiving signals between the main frame and the DUT; a deterministic jitter injecting unit for receiving the output signal without passing through the pin electronics and inputting a loop signal, which is the received output signal into which a deterministic jitter is injected, to an input pin of the DUT without passing through the pin electronics; and a switching unit for determining whether the input pin of the DUT is provided with the test signal output by the pin electronics or the loop signal output by the deterministic jitter injecting unit.

The pin electronics may include a driver for outputting the test signal to the input pin of the DUT and a comparator for receiving the output signal from an output pin of the DUT, and the deterministic jitter injecting unit may receive the output signal from the output pin without passing through the comparator and inputs the loop signal to the input pin without passing through the driver.

The pin electronics may includes a first pin card which corresponds to the input pin of the DUT and provides the input pin of the DUT with the test signal generated by the main frame; and a second pin card which corresponds to the output pin of the DUT and receives the output signal output by the DUT, and the switching unit may further include a first switching unit which corresponds to the input pin and determines whether the input pin is connected to the first pin card or the deterministic jitter injecting unit; and a second switching unit which corresponds to the output pin and determines whether the output pin is connected to the second pin card or the deterministic jitter injecting unit.

The switching unit and the deterministic jitter injecting unit may be provided on a switch board provided between the performance board and the pin electronics.

The deterministic jitter injecting unit may include a cable through which the output signal passes and which injects the deterministic jitter into the output signal.

The deterministic jitter injecting unit may include a first-order filter through which the output signal passes and which injects the deterministic jitter into the output signal.

The deterministic jitter injecting unit may further include a limiting amplifier for removing an amplitude degrading component from the loop signal into which the deterministic jitter is injected and providing the input pin with the loop signal.

The testing apparatus may further include a jitter amount control unit for controlling an amount of the deterministic jitter, which is injected into the output signal by the deterministic jitter injecting unit, by controlling a pattern of the output signal output by the DUT.

The testing apparatus may further include a jitter amount control unit for controlling an amount of the deterministic jitter, which is injected into the output signal by the deterministic jitter injecting unit, by controlling the length of the cable through which the output signal passes.

The testing apparatus may further include a jitter amount control unit for controlling an amount of the deterministic jitter, which is injected into the output signal by the deterministic jitter injecting unit, by controlling a response characteristic of the first-order filter.

The testing apparatus may further include a switch control unit for connecting the input pin and the first pin card to the first switch and the output pin and the second pin card to the second switch in case of performing a logic testing on the DUT, and connecting the input pin and the deterministic jitter injecting unit to the first switch and the output pin and the deterministic jitter injecting unit to the second switch in case of performing a jitter testing on the DUT.

The switch control unit may control the first switch via the first pin card and controls the second switch via the second pin card.

The main frame may provide the DUT with a control signal for outputting the output signal of a predetermined pattern to the DUT in case of performing the jitter testing.

The testing apparatus may further include a jitter measuring unit for measuring a jitter of at least of the loop signal and the output signal in case of performing the jitter testing.

The jitter measuring unit may acquire a jitter injected by a signal transmission path other than the deterministic jitter injecting unit on the basis of a pattern of the output signal and corrects the measured jitter value.

The main frame may include a means for injecting a sinusoidal jitter into the test signal.

The means for injecting a sinusoidal jitter may inject the sinusoidal jitter having a plurality of different frequency components into the test signal.

According to the second aspect of the present invention, a testing method for performing a jitter testing on a device under test (DUT) by using a testing apparatus including a performance board on which the DUT is mounted; a main frame for generating a test signal for testing the DUT and determining pass/fail of the DUT on the basis of an output signal output by the DUT; a pin electronics which is provided between the main frame and the performance board and performs sending and receiving signals between the main frame and the DUT; and a switching unit for determining whether or not the pin electronics is connected to the DUT, includes a switch control step of making the stitching unit disconnect the pin electronics and the DUT; and a deterministic jitter injecting step of receiving the output signal without passing through the pin electronics and inputting a loop signal, which is the received output signal into which a deterministic jitter is injected, to an input pin of the DUT without passing through the pin electronics.

The summary of the invention does not necessarily describe all necessary features of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

FIG. 11 shows an example of a relationship between an amount of the deterministic jitter generated in case of passing through a cable 38 and a pattern of an output signal.

FIG. 12 shows an example of a relationship between the amount of the deterministic jitter generated in case of passing through a first-order filter 42 and the pattern of the output signal.

FIG. 14A shows an example of an amplitude attenuation characteristic of a transmission path and the like. FIG. 14B shows a phase characteristic of the transmission path and the like.

FIG. 15 shows a comparison between a value of the jitter injected by the transmission path and the like calculated by a jitter measuring unit 26 and that actually measured.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
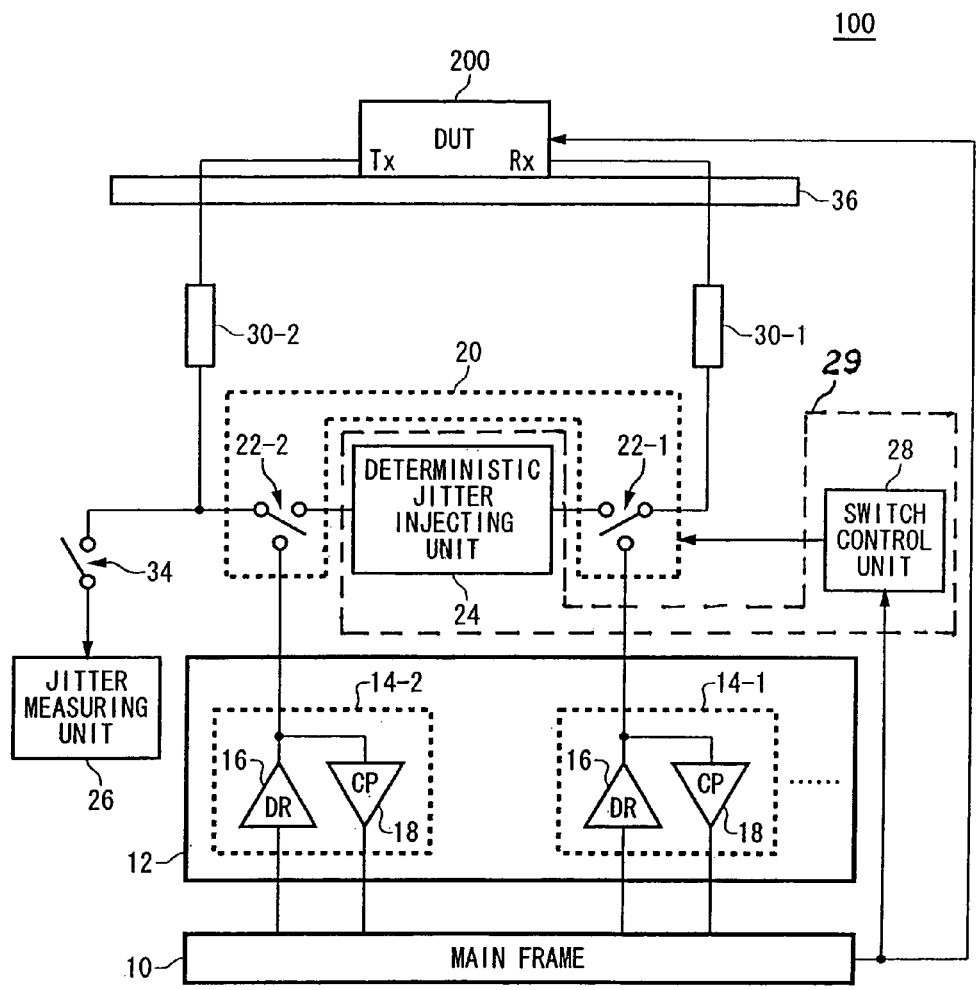
FIG. 1 shows an example of the configuration of a testing apparatus 100 according to an embodiment of the present invention.

FIG. 1 shows an example of the configuration of a testing apparatus 100 according to an embodiment of the present invention. The testing apparatus 100 is a testing apparatus for a device under test ("DUT") 200 such as a semiconductor circuit or a communication device, and includes a performance board 36, a main frame 10, a pin electronics 12, a deterministic jitter injecting unit 24, a switching unit 20, a switch control unit 28 and a jitter measuring unit 26. The testing apparatus 100 can perform a logic testing and a loop-back testing (jitter testing) on the DUT 200.

The main frame 10, for example, generates a test signal for performing a logic testing on the DUT 200 and determines the DUT pass/fail on the basis of output signal output by the DUT 200. The pin electronics 12 is provided between the main frame 10 and the performance board 36 and performs sending and receiving signals between the main frame 10 and the DUT 200. The main frame 10 and the pin electronics 12 may have a configuration conventionally used to a so-called ATE system, and operates mainly for performing a logic testing on the DUT 200. For example, the main frame 10 may include a pattern generating unit for generating a test pattern, a waveform formatting unit for formatting a test signal on the basis of the test pattern, a timing generating unit for controlling a timing (phase) of the test signal, and a determining unit for determining the DUT pass/fail on the basis of the output signal of the DUT 200.

The pin electronics 12 includes a plurality of pin cards 14-1 and 14-2 (hereinafter, to be referred to by a reference numeral 14, collectively). Each pin card 14 includes a driver 16 and a comparator 18, and is connected to a corresponding input and/or output pin of the DUT 200. According to the present embodiment, the first and second pin cards 14-1 and 14-2 correspond to the input and output pins Rx and Tx of the DUT 200, respectively.

The switching unit 20 is provided between the pin electronics 12 and the input and/or output pin of the DUT 200, and determines whether or not the pin card 14 is connected to the input and/or output pin of the DUT 200. The switching unit 20 of the present embodiment includes a first and second switch 22-1 and 22-2 corresponding to the first and second pin cards 14-1 and 14-2, respectively. The switching unit 20 and the deterministic jitter injecting unit 24 may be provided on a switch board 29 provided between the performance board 36 and the pin electronics 12.

When a logic testing is performed on the DUT 200, the switching unit 20 connects the pin electronics 12 and the input and/or output pin of the DUT 200. Then, the main frame 10 provides the test signal to the DUT via the pin electronics 12, receives the output signal from the DUT 200 via the pin electronics 12 and determines the DUT pass/fail.

The deterministic jitter injecting unit 24 inputs a loop signal, which is the output signal of the DUT 200 into which the deterministic jitter is injected, to the input pin Rx of the DUT 200 by feedback. The deterministic jitter injecting unit 24 is configured so that it can receive the output signal of the DUT 200 without passing through the pin electronics 12 and input the loop signal into the input pin of the DUT 200 without passing through the pin electronics 12. According to the present embodiment, the deterministic jitter injecting unit 24 is provided between the first and second switches 22-1 and 22-2, and connected to the input and output pins Rx and Tx of the DUT 200 via the first and second switches 22-1 and 22-2, respectively.

In other words, the first switch 22-1 switches an input source for the input pin Rx of the DUT 200 between the test signal output by the first pin card 14-1 and the loop signal output by the deterministic jitter injecting unit 24. Further, the second switch 22-2 switches an output destination to which the output signal output by the output pin Tx of the DUT 200 between the second pin card 14-2 and the deterministic jitter injecting unit 24.

When a loop-back testing is performed on the DUT 200, the first switch 22-1 connects the input pin Rx of the DUT 200 to the output terminal of the deterministic jitter injecting unit 24, and the second switch 22-2 connects the output pin Tx of the DUT 200 to the input terminal of the deterministic jitter injecting unit 24.

The control of the switch may be performed by the switch control unit 28 on the basis of instructions from the main frame 10 or by the main frame 10 via the pin card 14 corresponding to each switch 22.

When the loop-back testing is performed, the main frame 10 provides the DUT 200 with a control signal for outputting an output signal of a predetermined pattern from the output pin Tx connected to the deterministic jitter injecting unit 24. The main frame 10 may provide the DUT 200 with the control signal via the pin card 14 corresponding to the pin of the DUT 200 which is not connected to the deterministic jitter injecting unit 24.

The jitter measuring unit 26 is connected to the output pin Tx of the DUT 200 via the switch 34 and receives the power split output signal output by the DUT 200. For example, the jitter measuring unit 26 may detect a bit error of the output signal or calculate a jitter value in the received output signal. Further, the jitter measuring unit 26 may be connected to the output terminal of the deterministic jitter injecting unit 24, receive the loop signal output by the deterministic jitter injecting unit 24 and measure the jitter of the loop signal.

For example, it is possible to easily measure the jitter tolerance of the DUT 200 by changing the amount of the jitter injected by the deterministic jitter injecting unit 24 until an occurrence of a single bit error is detected. The deterministic jitter value at the boundary, which separates the erroneous region and the error-free region, gives jitter tolerance. Similarly, by detecting the value of deterministic jitter being greater than the threshold value, jitter tolerance is measured.

It is also possible to detect the bit error in the output signal by making the deterministic jitter injecting unit 24 inject a deterministic jitter which equals to a pre-defined threshold for determining the DUT pass/fail. In this case, it is possible to perform the testing in an extremely short time since it is enough to detect the bit error by only applying a single amount of the deterministic jitter.

According to the above configuration and control, it is possible to perform a loop-back testing on the DUT 200 by using the conventional so-called ATE. Further, according to the testing apparatus of the present embodiment, it is possible to perform the loop-back testing with high accuracy even in case the DUT 200 operates with high data rate since the output signal is received from the output pin Tx without passing through the comparator 18 of the pin electronics 12 and the loop signal is input into the input pin Rx without passing through the driver 16. Further, it is possible to secure an area for deploying other parts on the performance board since the deterministic jitter injecting unit 24 can be provided on the board of the switching unit.

Figure 2:
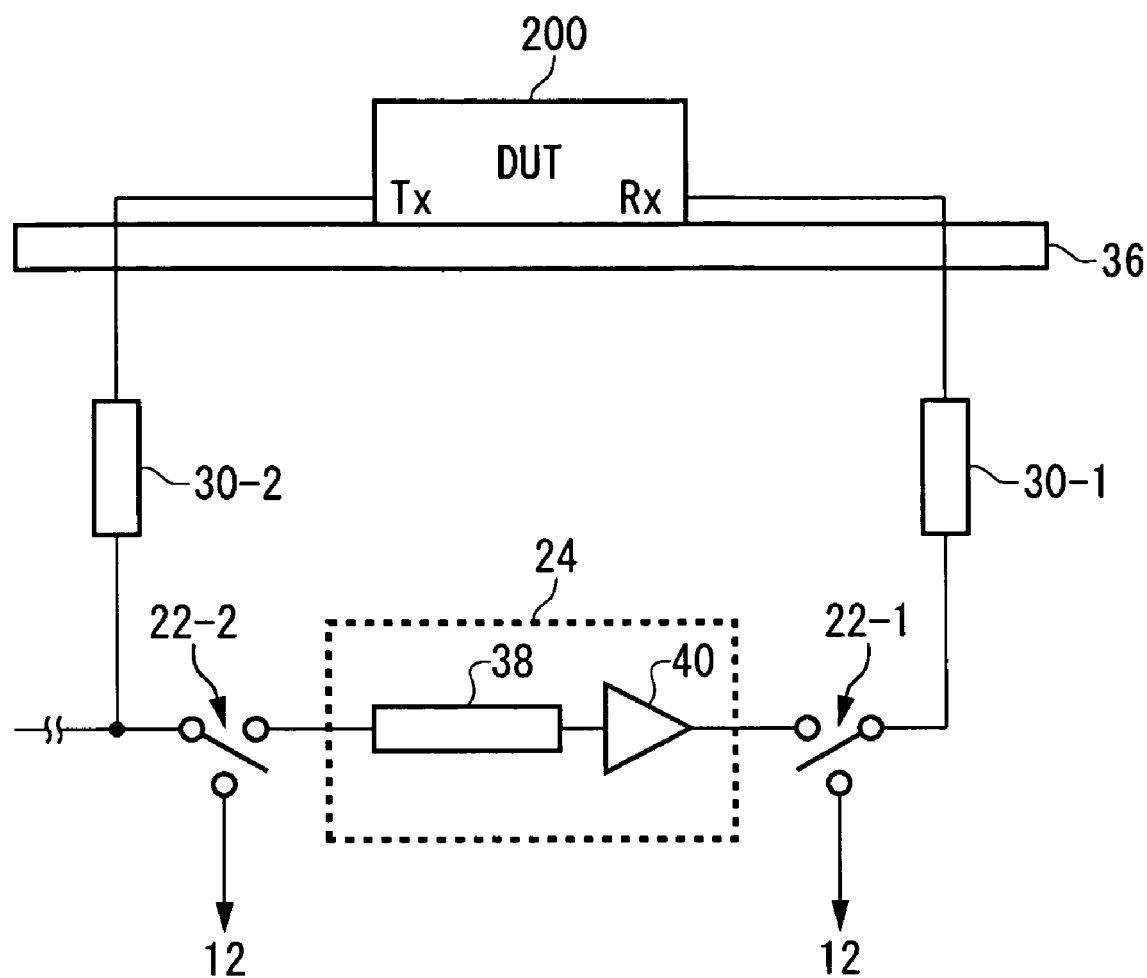
FIG. 2 shows an example of the configuration of a deterministic jitter injecting unit 24.

FIG. 2 shows an example of the configuration of the deterministic jitter injecting unit 24. The deterministic jitter injecting unit 24 of the present embodiment includes a cable 38 and a limiting amplifier 40. The cable 38 applies the deterministic jitter to the output signal by passing the output signal of the DUT 200. An amount of the injected deterministic jitter may be determined on the basis of a length and characteristics of the cable 38. For example, when a long cable 38 is used, the transfer characteristics of the cable 38 are deteriorated. Therefore, a delay of the signal edge, which is generated as reduced amplitude level of the output signal and edge rate of the signal becomes degraded, is changed according to the length of the cable 38. Further, the delay of the signal edge varies according to the data pattern of the output signal. Therefore, it is possible to inject a desired amount of the deterministic jitter into the output signal by controlling the data pattern and the length of the cable 38.

The testing apparatus 100 may further include a jitter amount control unit for controlling the amount of the deterministic jitter injected into the output signal by the deterministic jitter injecting unit 24 by controlling the length of the cable 38 through which the output signal transmitted. Details of the jitter amount control unit are described later with reference to FIG. 9.

Figure 3:
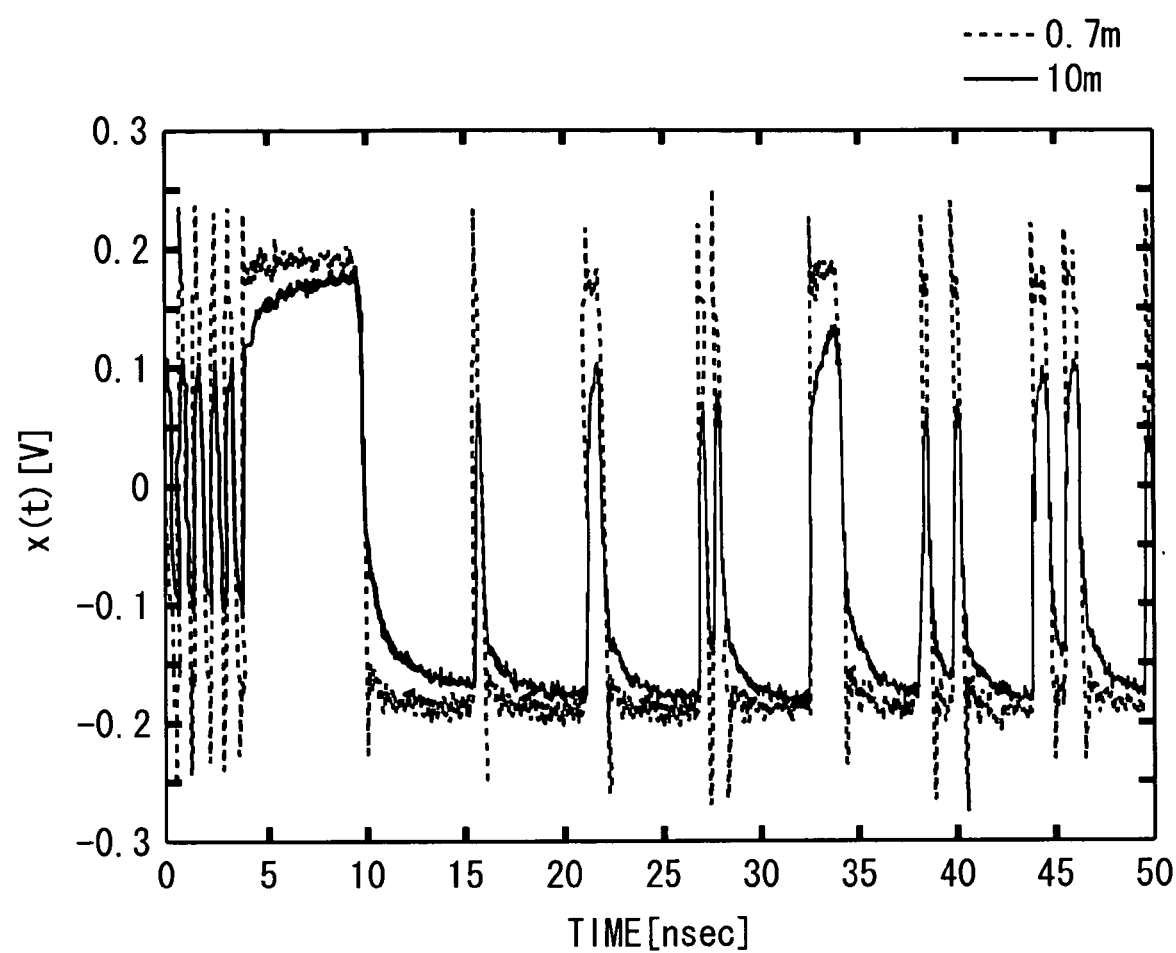
FIG. 3 shows an example of the waveform of a Pseudo-Random Binary Sequence ("PRBS") signal when the signal passes through a coaxial cable of 0.7 or 10 meter in length.

FIG. 3 shows an example of the waveform of the Pseudo-Random Binary Sequence ("PRBS") signal when the signal passes through a coaxial cable of 0.7 or 10 meter in length. As shown in FIG. 3, the amplitude level of the PRBS signal changes according to the length of the cable.

Further, according to the conventional testing method, a second-order filter through which the output signal passes is used as a deterministic jitter injecting means. In case of using the second-order filter, the amplitude level of the signal is reduced and an extreme value is generated in the variation of the amplitude as described above. However, in case of using the cable as the deterministic jitter injecting means, the reduction of the amplitude level of the signal becomes smooth and it is possible to decrease the extreme value of the amplitude variation as shown in FIG. 3.

Figure 4A:
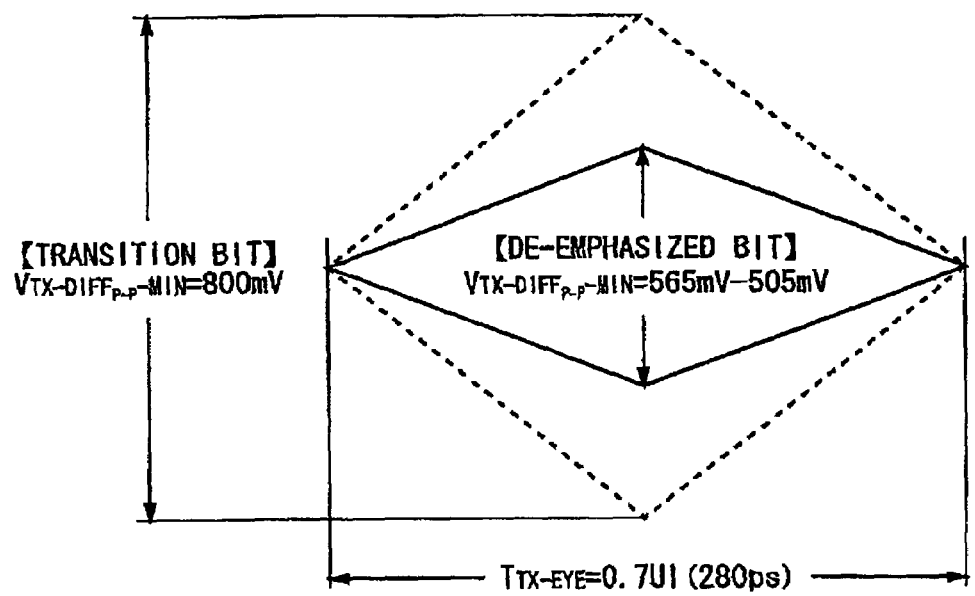
FIG. 4A shows an eye opening which an output signal of a DUT 200 should satisfy.
Figure 4B:
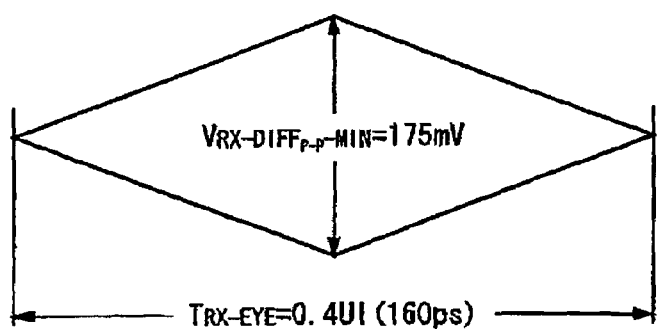
FIG. 4B shows an eye opening which an input signal of the DUT 200 should satisfy.

Further, the signal used in the DUT 200 generally has a regulated minimum of an eye opening. For example, in case the output signal of the DUT 200 satisfies the eye opening shown in FIG. 4A under the specifications of PCI Express, the input signal of the DUT 200 is required to have the eye opening shown in FIG. 4B.

Figure 5:
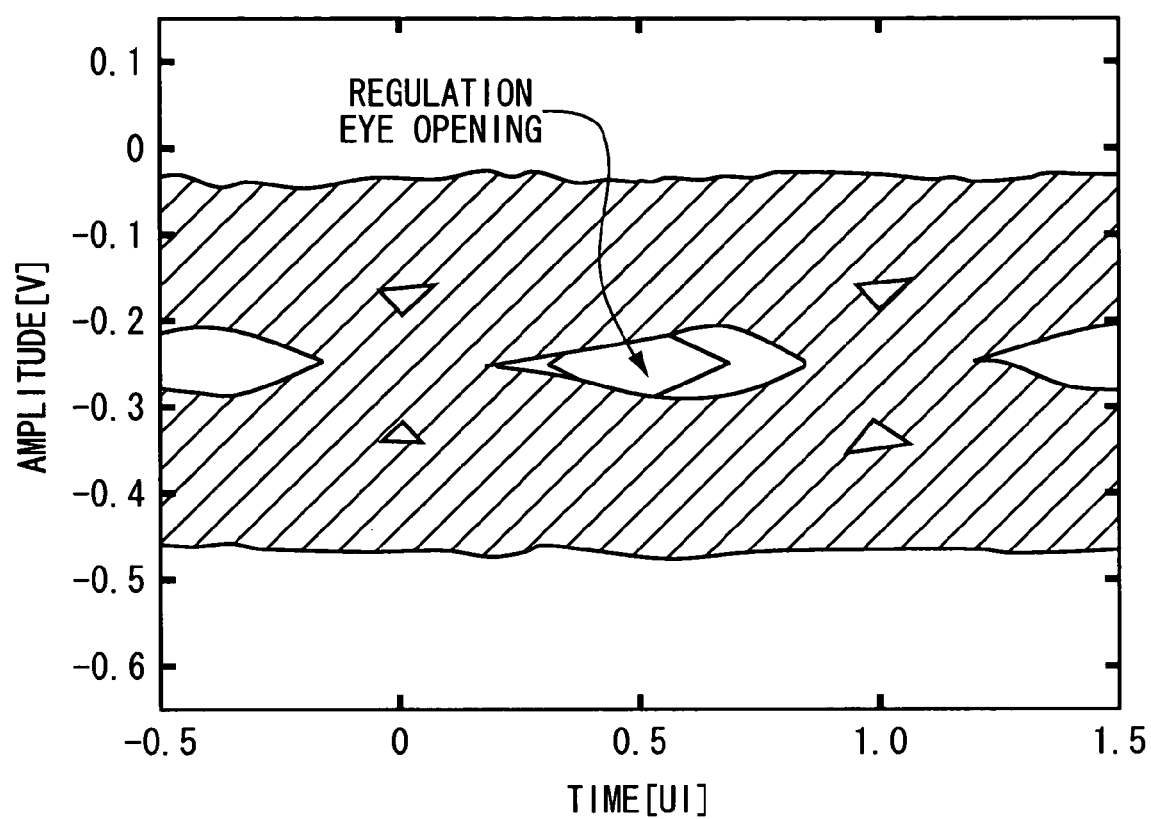
FIG. 5 shows a relationship between an input signal and a regulation eye opening.
Figure 6:
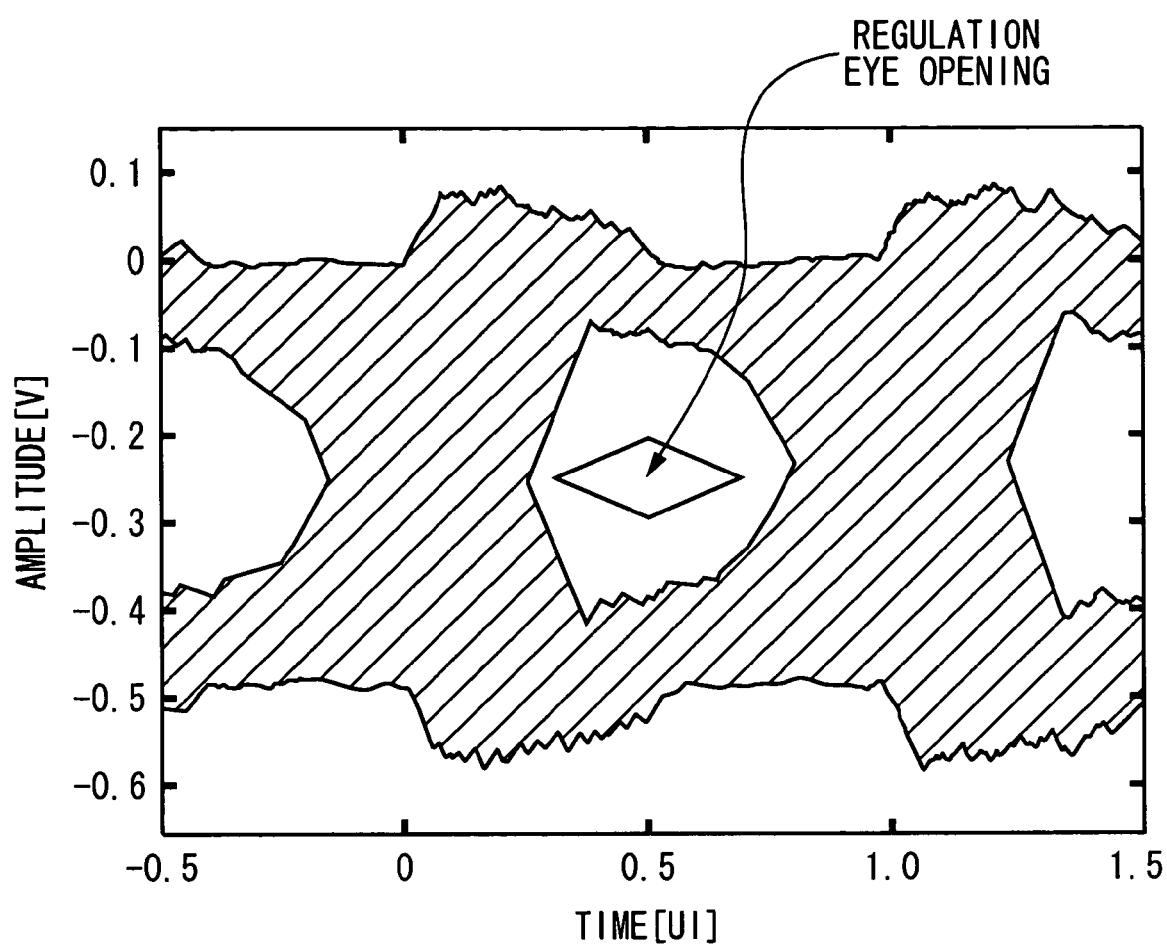
FIG. 6 shows a relationship between the input signal from which an amplitude degrading component is removed and the regulation eye opening.

However, in case the deterministic jitter is injected by using the cable and the like so as to satisfy the regulation, sometimes it is impossible to ensure the eye opening with respect to the ordinate axis as shown in FIG. 5. This is due to the reduction of the amplitude level generated when the deterministic jitter is injected. In comparison, the deterministic jitter injecting unit 24 includes the limiting amplifier 40 for removing amplitude degrading components from the loop signal which passes through the cable 38 and into which the deterministic jitter is injected and proving the input pin Rx with the loop signal. The limiting amplifier 40 is, for example, a circuit for amplifying a received loop signal and removing a component of which amplitude level is lower than a predetermined value. By this kind of configuration, as shown in FIG. 6, it is possible to provide the DUT 200 with a loop signal satisfying a regulation eye opening. Further, the position of the limiting amplifier is not limited to the inside of the deterministic jitter injecting unit 24. The limiting amplifier may be provided on any location of the path from the output terminal of the deterministic jitter injecting unit 24 to the input pin Rx.

Further, it is preferable that the limiting amplifier 40 can control the predetermined amplitude level and the amplitude of the output signal. Thus, it is possible to output signals of various eye openings and make the eye opening of the output signal satisfy various standards.

Figure 7:
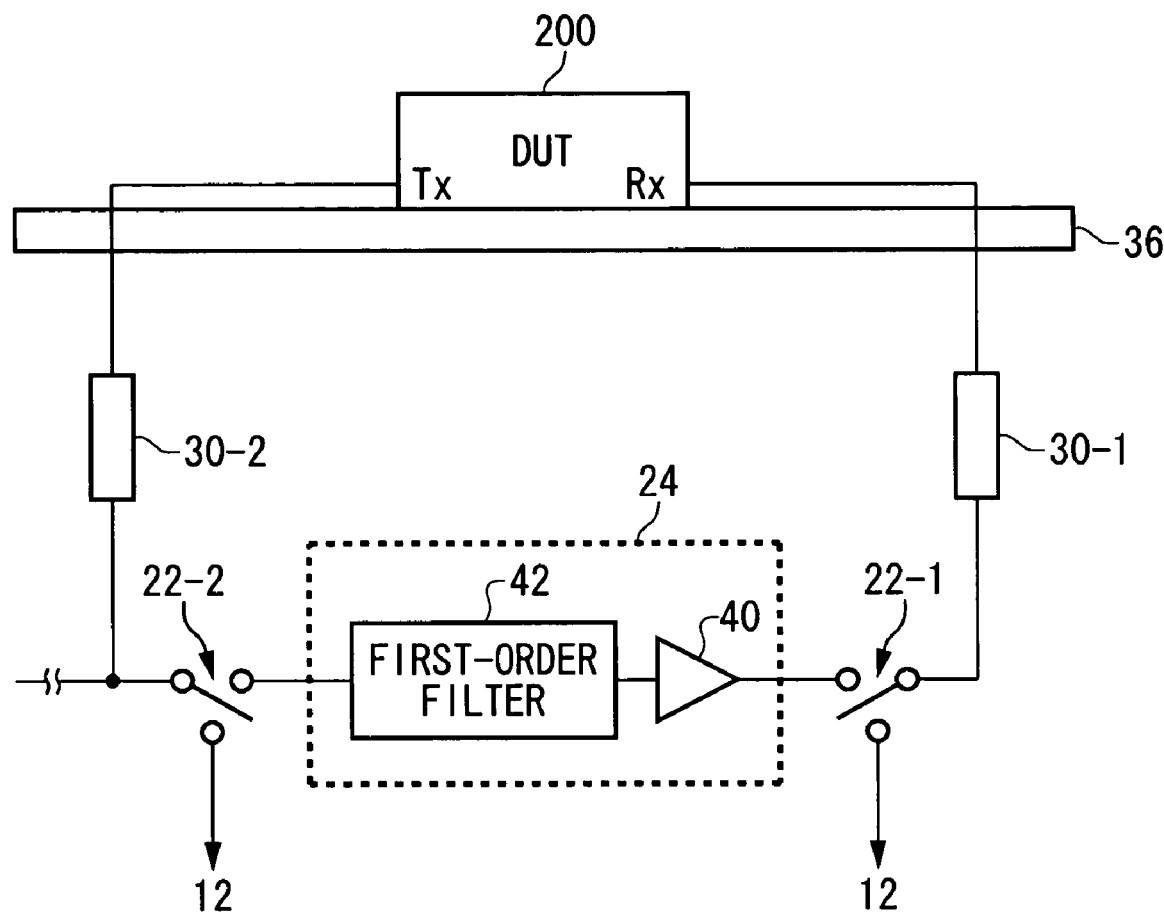
FIG. 7 shows another example of the configuration of the deterministic jitter injecting unit 24.

FIG. 7 shows another example of the configuration of the deterministic jitter injecting unit 24. The deterministic jitter injecting unit 24 according to the present example includes a first-order filter 42 and a limiting amplifier 40. Functions of the limiting amplifier 40 are the same as those of the limiting amplifier 40 shown in FIG. 2.

Figure 8:
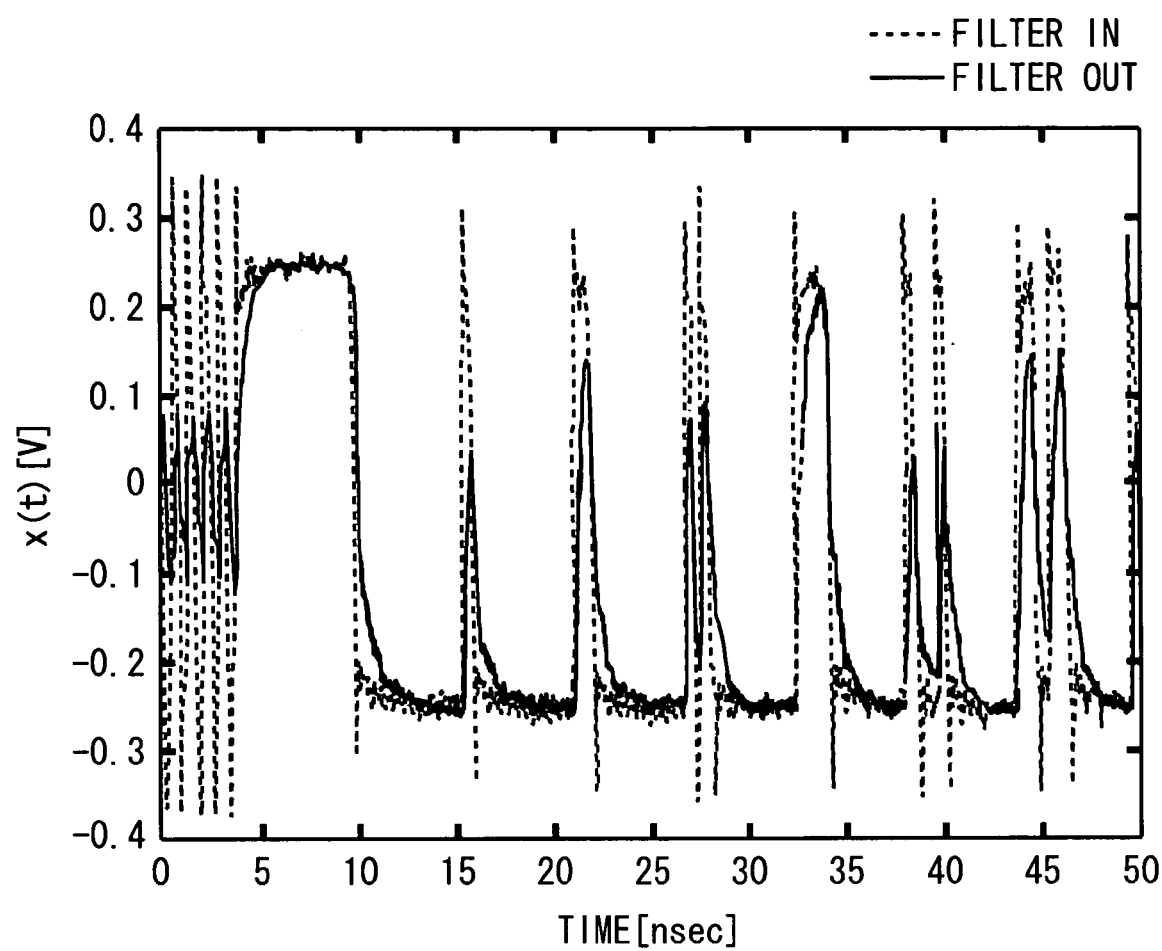
FIG. 8 shows an example of the waveform of a signal which passes through a first-order filter.

The first-order filter 42 injects a deterministic jitter into the output signal by passing the output signal. The first-order filter 42 includes a resistance through which the output signal passes and a capacitor provided between an output end of the resistance and a ground potential and makes the amplitude level of the passed signal smoothly reduced as shown in FIG. 8. Thus, it is possible to degrade the waveform of a signal according to the pattern of the signal and then inject a deterministic jitter. Further, it is possible to lessen the problem of a extreme value generated in the amplitude variation.

Figure 9:
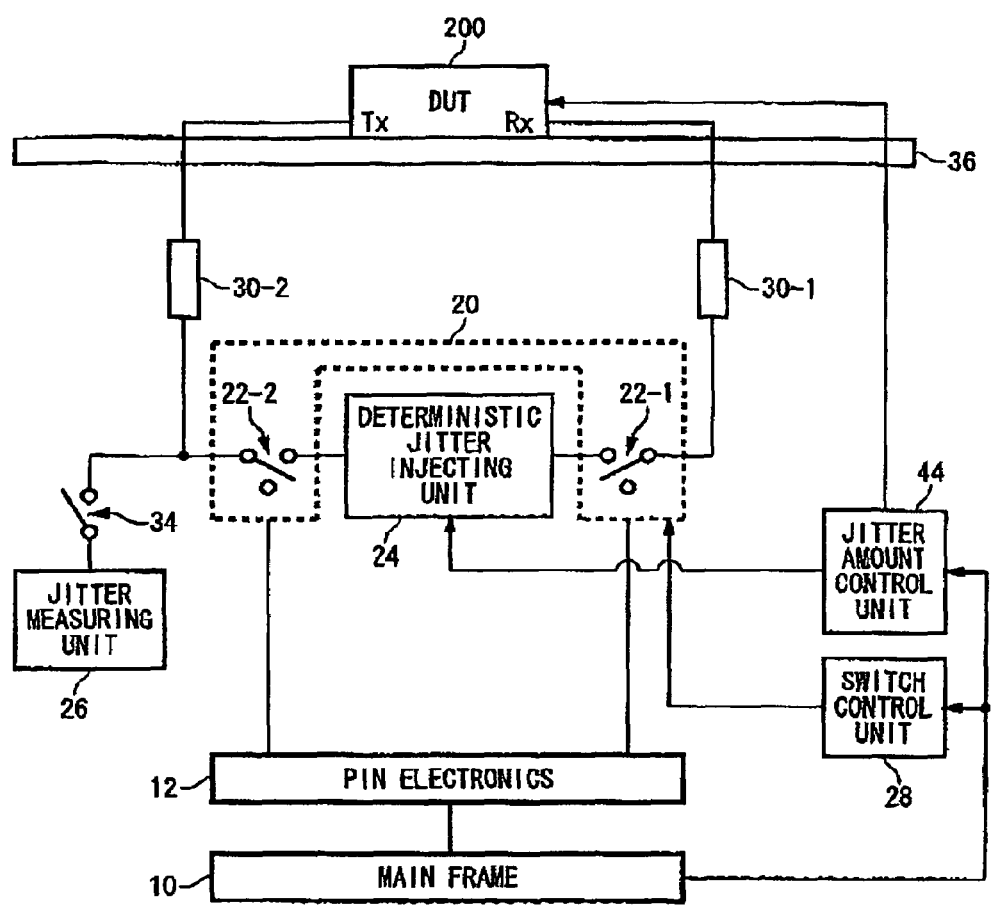
FIG. 9 shows another example of the testing apparatus 100.

FIG. 9 shows another example of the testing apparatus 100. The testing apparatus 100 according to the present example includes further a jitter amount control unit 44 in addition to the configuration of the testing apparatus 100 described with respect to FIG. 1. The jitter amount control unit 44 controls an amount of the deterministic jitter injected into the output signal by the deterministic jitter injecting unit 24.

For example, the jitter amount control unit 44 controls the amount of the deterministic jitter injected into the output signal by the deterministic jitter injecting unit 24 by controlling the pattern of the output signal output by the DUT 200. In this case, the jitter amount control unit 44 makes the DUT 200 output an output signal of a pattern according to the amount of the jitter which should be injected. The pattern may be generated by the main frame 10 and provided to the DUT 200. It is possible to control the amount of the deterministic jitter by this kind of control because the amount of the deterministic jitter injected into the output signal by the deterministic jitter injecting unit 24 is varied according to the pattern of the passing output signal.

Figure 10A:
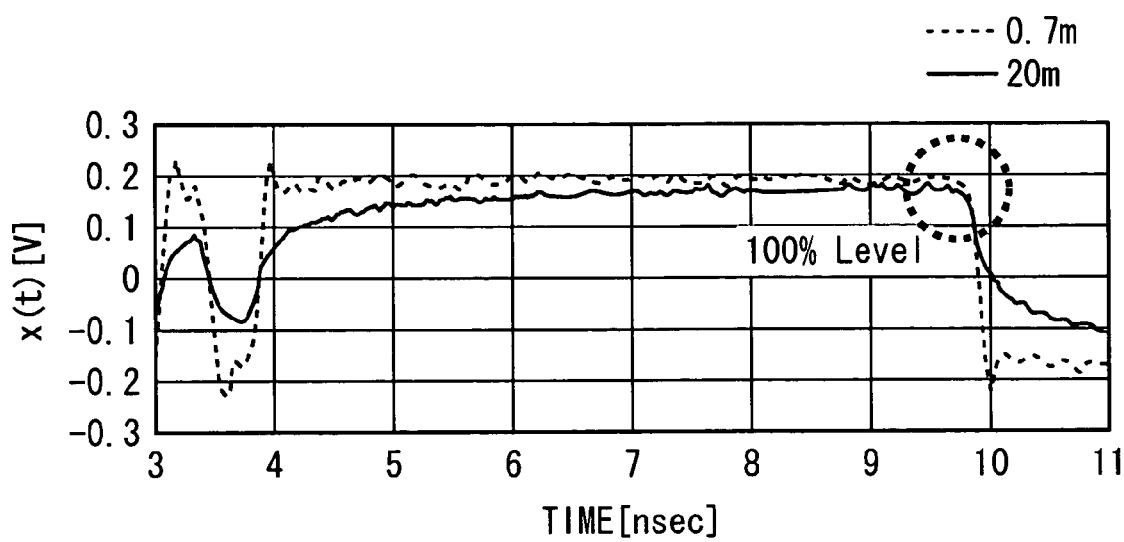
FIG. 10A shows the waveform of an output signal of a data pattern showing that a delay of the output signal which passes through the deterministic jitter injecting unit 24 becomes the maximum.

FIG. 10A shows the waveform of an output signal of a data pattern showing that a delay of the output signal which passes through the deterministic jitter injecting unit 24 becomes the maximum. According to the present example, a coaxial cable of 0.7 or 10 meter in length is used as a deterministic jitter injecting means. Since sufficiently large number of bits (time four (4) to nine (9)) taking H logic continuously as shown in FIG. 10A, the amplitude level of the output signal reaches 100 percent (%). In this case, if the data pattern changes from the H logic to the L logic, the time taken for the waveform of the output signal to reach the amplitude level corresponding to the L logic becomes the maximum. Thus, the amount of the deterministic jitter, being injected, in transmitting the output signal through the cable 38, becomes the maximum.

Figure 10B:
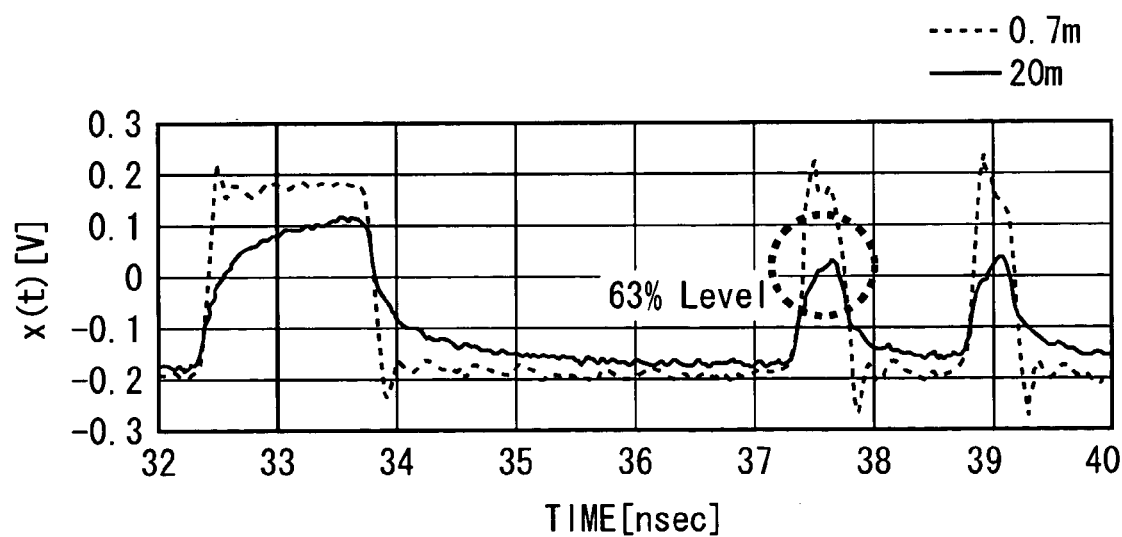
FIG. 10B shows the waveform of the output signal of a data pattern showing that the delay of the output signal which passes through the deterministic jitter injecting unit 24 becomes the minimum.

FIG. 10B shows the waveform of the output signal of a data pattern showing that the delay of the output signal which passes through the deterministic jitter injecting unit 24 becomes the minimum. Since sufficiently large number of bits taking L logic continuously as shown in FIG. 10B, the amplitude level of the output signal reaches 0 percent (%). In this case, if the data pattern changes from the L logic to the H logic and duration of H logic bits is insufficient for the amplitude level of the output signal to reach 100 percent (%). Thus, the amplitude level of the output signal becomes being lower than 100 percent (%). If data of L logic is applied following data of the minimum run length, the time taken for the waveform of the output signal to cross the amplitude level corresponding to the L logic becomes the minimum. Thus, the amount of the deterministic jitter, which is injected by transmitting the output signal through the cable 38, also becomes the minimum.

As above, the jitter amount control unit 44 controls the pattern of the output signal and thus it is possible to inject a deterministic jitter of a desired amount. It is preferable to measure a relationship between the pattern of the output signal and the amount of the deterministic jitter in advance.

Figure 11A:
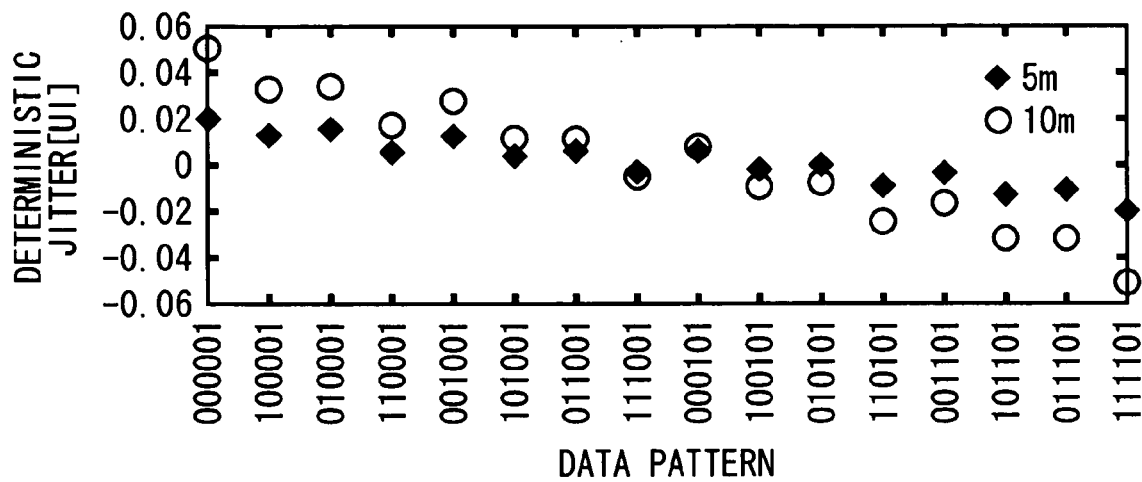
FIGS. 11A and 11B show the amounts of the deterministic jitter generated at a rising edge and a falling edge of the output signal, respectively.
Figure 11B:
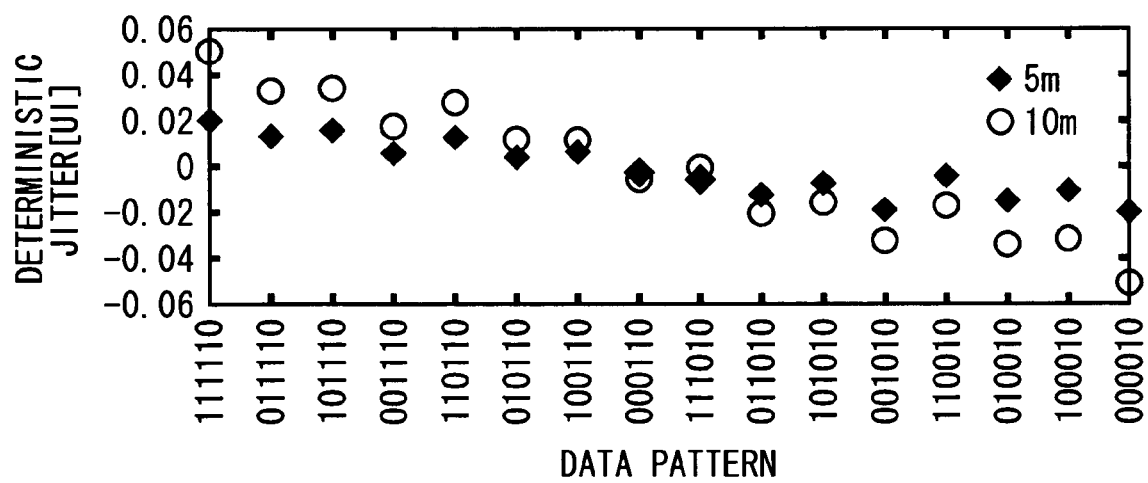

FIG. 11 shows an example of a relationship between the amount of the deterministic jitter generated by transmitting signal through the cable 38 and a pattern of the output signal. FIGS. 11A and 11B show the amounts of the deterministic jitter generated at a rising edge and a falling edge of the output signal, respectively. Further, according to the present example, a coaxial cable of 5 or 10 meter in length is used as the cable 38.

Figure 12A:
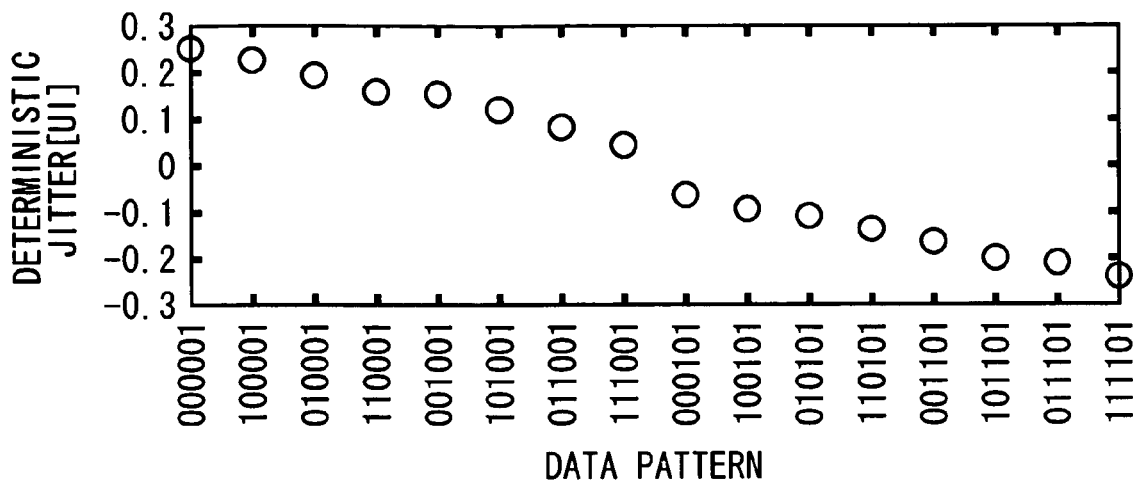
FIGS. 12A and 12B show the amounts of the deterministic jitter generated at a rising edge and a falling edge of the output signal, respectively.
Figure 12B:
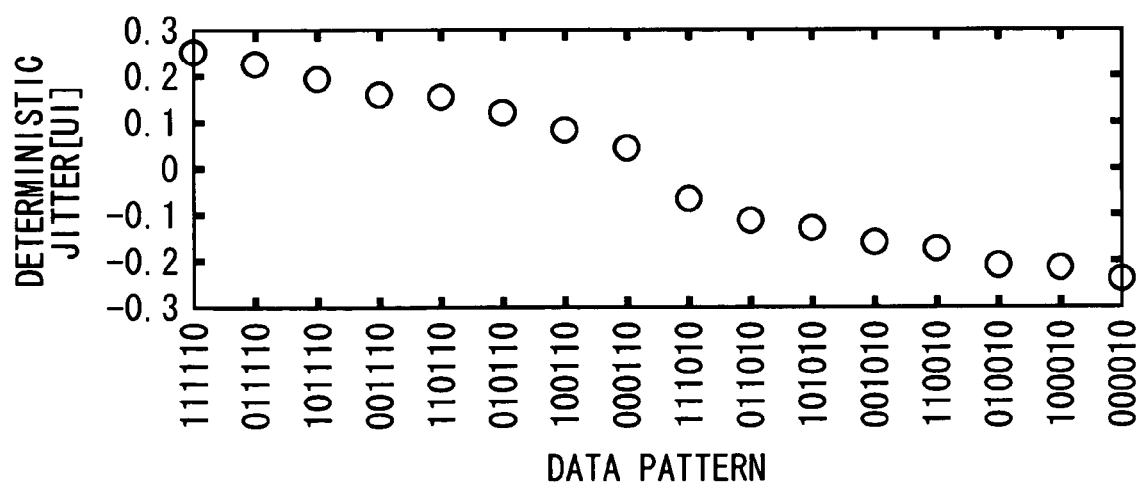

FIG. 12 shows an example of a relationship between the amount of the deterministic jitter generated by passing the signal through the first-order filter 42 and the pattern of the output signal. FIGS. 12A and 12B show the amounts of the deterministic jitter generated at a rising edge and a falling edge of the output signal, respectively.

As shown in FIGS. 11 and 12, it is possible to inject a desired amount of the deterministic jitter into the output signal by controlling the pattern of the output signal.

Further, the jitter amount control unit 44 may control the amount of the deterministic jitter injected into the output signal by the deterministic jitter injecting unit 24 by controlling the length of the cable 38 through which the output signal passes. As shown in FIG. 11, the amount of the deterministic jitter injected into the output signal is varied according to the length of the cable 38 through which the output signal passes. For example, the deterministic jitter injecting unit 24 may include a plurality of cables of different lengths and a selecting unit for selecting which one of the plurality of cables the output signal passes through and the jitter amount control unit 44 may control which cable is to be selected by the selecting unit.

Further, the jitter amount control unit 44 may control the amount of the deterministic jitter injected into the output signal by the deterministic injecting unit 24 by controlling a response characteristic of the first-order filter 42. Since the amplitude degradation (edge rate degradation) of the output signal is varied by controlling the response characteristic of the first-order filter 42, it is possible to control the amount of the deterministic jitter by controlling the response characteristic. For example, the jitter amount control unit 44 may control the amount of the deterministic jitter by controlling the resistance of a variable resistor and the capacitance of a variable capacitor in the first-order filter 42.

Further, the output signal output by the DUT 200 is transmitted through transmission paths 30-1 and 30-2 as shown in FIG. 1 or 9, a socket on which the DUT 200 is mounted, and a connector, in addition to the deterministic jitter injecting unit 24. Since each of these kinds of transmission paths different from the cable 38 (hereinafter, to be referred to by reference numerals 30-1 and/or 30-2, respectively) has a finite transmission band width, a jitter is injected into the output signal by transmitting output signal passes through the transmission path, similarly with a jitter's being injected at the cable 38. It is preferable that the jitter measuring unit 26 estimates the amount of the deterministic jitter of the loop signal provided to the input pin Rx of the DUT 200 by correcting the amount of the deterministic jitter injected by the deterministic jitter injecting unit 24 by using the amount of the jitter injected at the transmission path 30-1. For example, the amount of the deterministic jitter of the loop signal actually provided to the DUT 200 is estimated by adding the amount of the jitter injected at the other transmission path 30-1 to the amount of the deterministic jitter injected by the deterministic jitter injecting unit 24. It is preferable to measure the amount of the jitter injected at the other transmission path 30-1 in advance.

It is possible to accurately estimate the deterministic jitter of the loop signal actually input to the DUT 200 by this kind of correction and to accurately measure a jitter tolerance of the DUT 200.

Similarly, the jitter measuring unit 26 may estimate the amount of the deterministic jitter of the output signal of the DUT 200 by subtracting an amount of a jitter, which is injected into the output signal on a transmission path 30-2 from the output pin Tx of the DUT 200 to a measurement point, from the measure jitter amount.

For example, in advance the amount of the jitter injected at the other transmission path is measured by the jitter measuring unit 26. In this case, a transfer characteristic of the other transmission path in the frequency domain and the waveform of the output signal output by the DUT 200 are previously applied to the jitter measuring unit 26. It is preferable that the transfer characteristic is previously measured by, for example, a network analyzer. It is preferable that the transfer characteristic is measured for all the transmission paths under a condition that all elements of each transmission path are deployed. Further, the transfer characteristic may be measured for each transmission path.

The jitter measuring unit 26 calculates the waveform by transmitting the output signal through the other transmission path on the basis of the waveform of the applied output signal and the transfer characteristic of the other transmission path.

Figure 13:
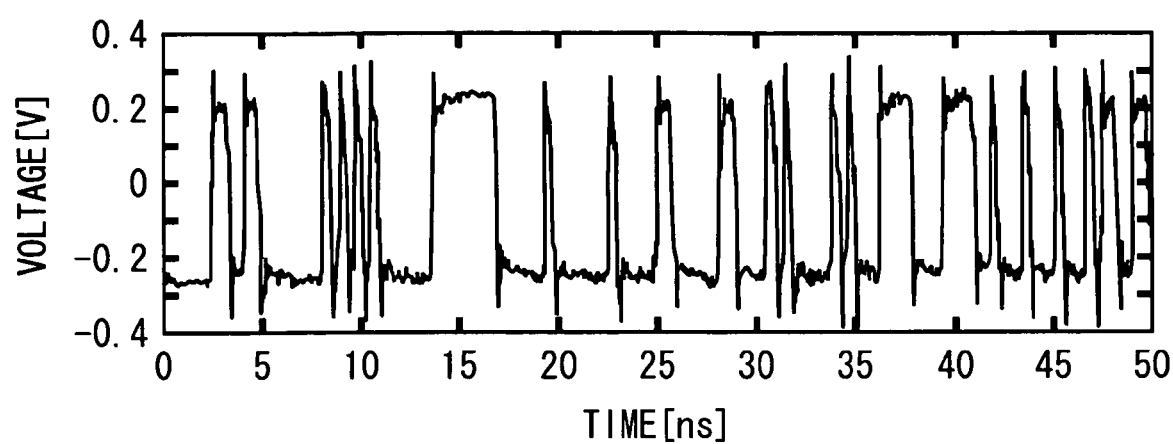
FIG. 13 shows an example of the waveform of an output signal output by the DUT 200.

FIG. 13 shows an example of the waveform of the output signal output by the DUT 200. As shown in FIG. 13, the waveform is a square wave in which there is no degradation. The jitter measuring unit 26 multiplies a spectrum estimated by applying Fourier transformation to the waveform by the transfer characteristic of the transmission path as a complex number and estimates a spectrum of a signal passing through the transmission path and the like. In other words, a spectrum of a signal passing through the transmission path is acquired by multiplying a power spectrum acquired by applying Fourier transform to the output signal by an amplitude attenuation (gain) characteristic of the transmission path, acquiring a power spectrum of the signal passing through the transmission path, adding a phase characteristic of the transmission path to a phase spectrum estimated by applying Fourier transformation to the output signal, and estimating a phase spectrum of the signal passing through the transmission path.

Figure 14A:
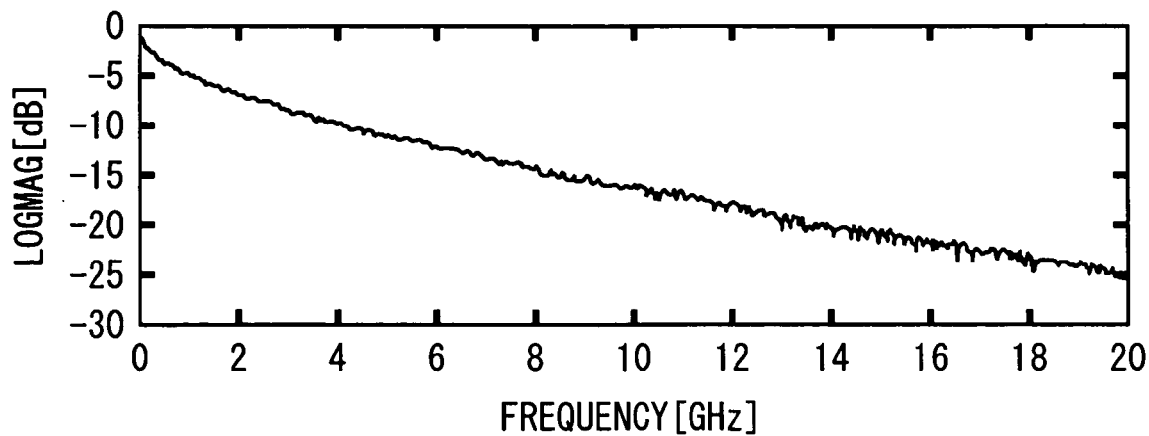
Figure 14B:
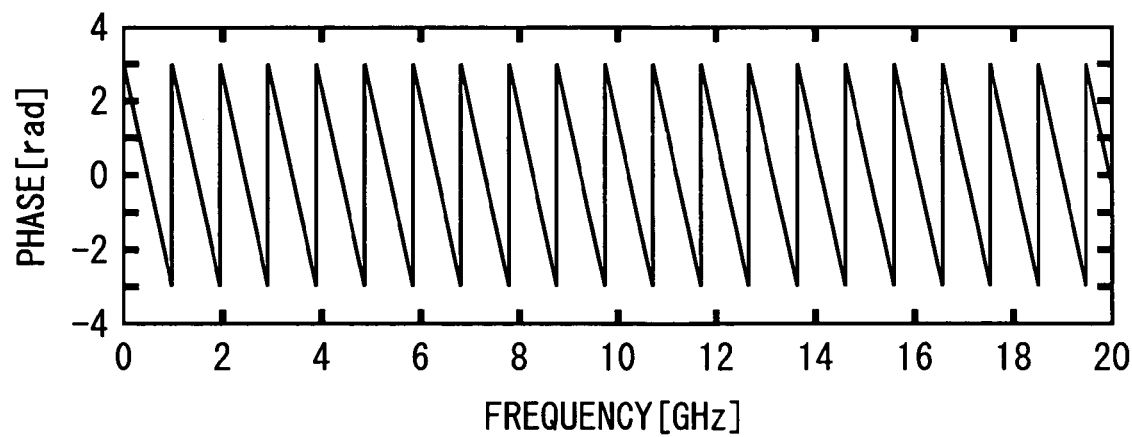

FIG. 14A shows an example of an amplitude attenuation characteristic of the transmission path and the like. FIG. 14B shows a phase characteristic of the transmission path and the like. As described above, the jitter measuring unit 26 applies inverse Fourier transform to a spectrum estimated by multiplying the transfer characteristic of the transmission path and the like by the spectrum of the output signal and calculates the waveform of the signal passing through the transmission path and the like. Then, the jitter measuring unit 26 compares the signal waveforms before and after being input and output from the transmission path and the like and calculates an amount of the jitter injected by the transmission path and the like.

FIG. 15 shows a comparison between a value of the jitter injected by the transmission path and the like calculated by a jitter measuring unit 26 and that actually measured. As shown in FIG. 15, the jitter value estimated by the method described above coincides with the jitter value actually measured with an error of two percent (%) in a root-mean-square value and an error of 0.6 percent (%) in a peak-to-peak value.

According to the testing apparatus described above, it is possible to perform a loop-back testing on the DUT 200 by using only the cable 38 and the first-order filter 42 and to reduce the cost of the testing apparatus. Further, since it is possible to perform the loop-back testing via the pin electronics 12, it is possible to remove influence of the degradation of the signal at the driver 16, the comparator 18, etc, and perform measurement with high accuracy. Further, it is possible to perform a testing without taking reflections of the signal at the driver 16, and the like, into consideration. Further, using the limiting amplifier 40 removing amplitude degrading components associated with injecting a deterministic jitter from the output signal. It is possible to perform a timing testing on the DUT with high accuracy by using the limiting amplifier 40. Further, since it is possible to deploy the deterministic jitter injecting unit 24 at a place having room and to spare, a testing on the DUT 200 with multi-lane serial interface can be performed with a simple constitution.

Figure 16:
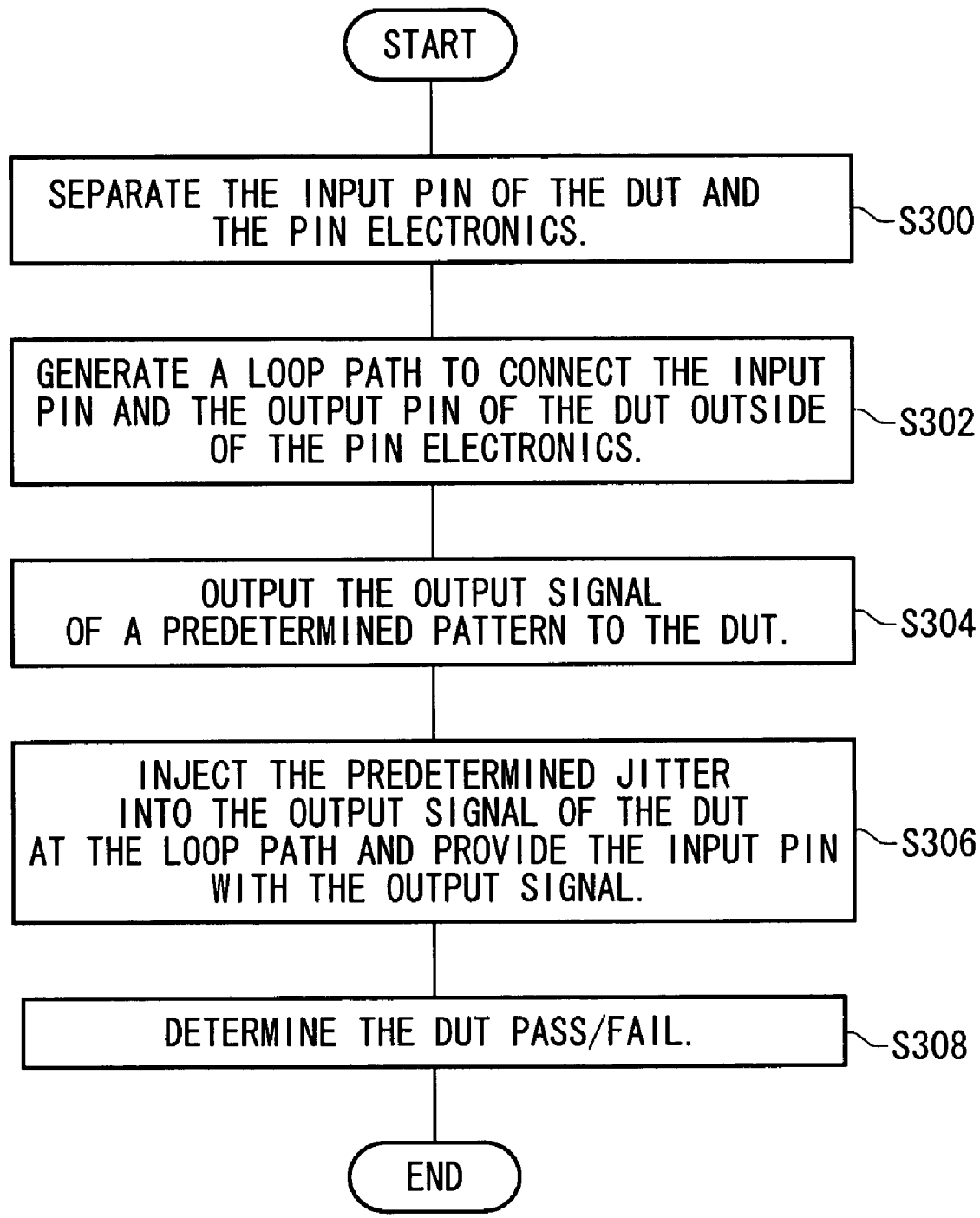
FIG. 16 is a flowchart showing an example of a testing method performing a loop-back testing on the DUT 200 by using the testing apparatus 100.
Figure 17:
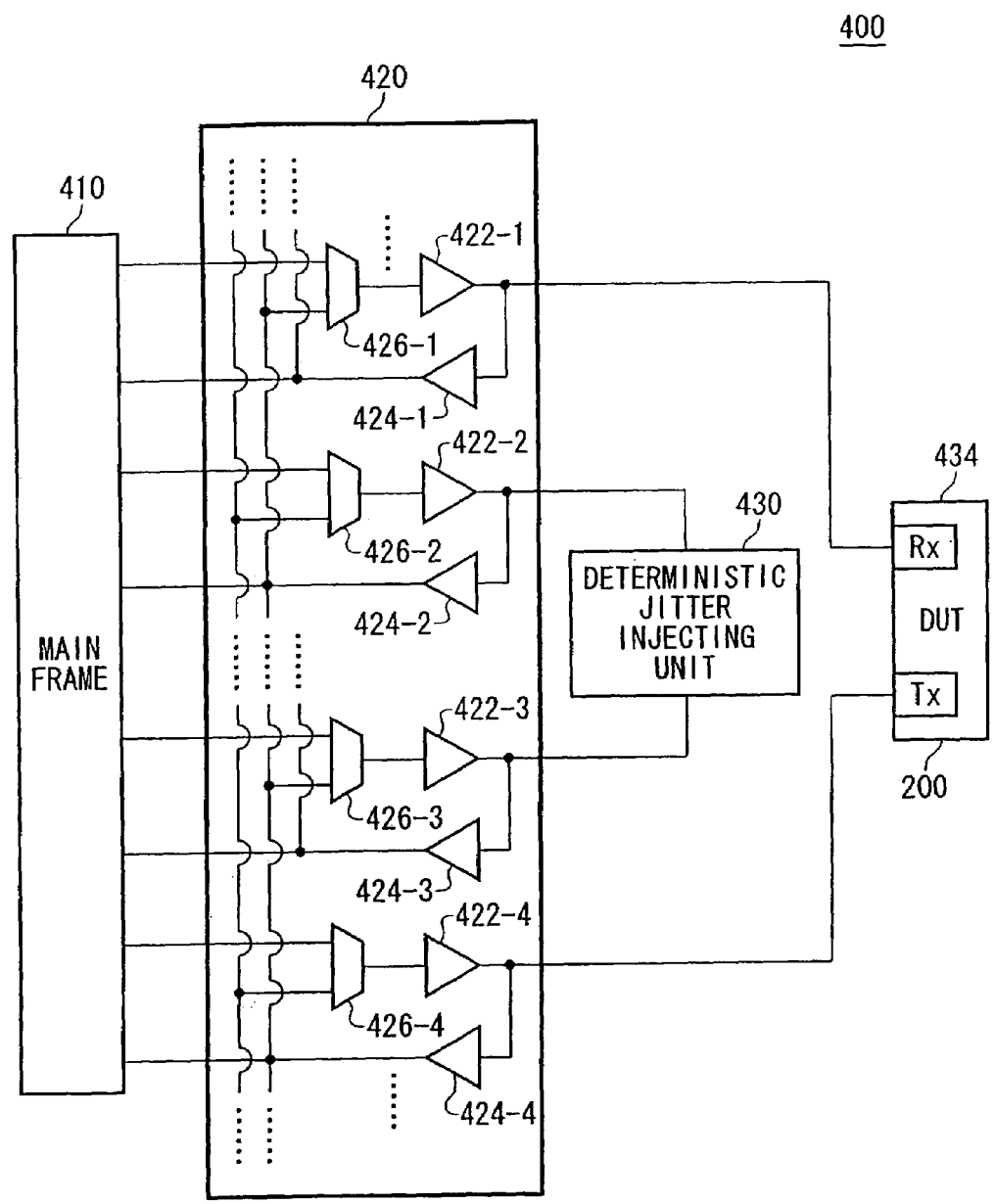
FIG. 17 shows a conventional loop-back testing method.

FIG. 16 is a flowchart showing an example of a testing method performing a loop-back testing on the DUT 200 by using the testing apparatus 100. In case of performing a loop-back testing, the input pin of the DUT 200 and the pin electronics 12 are separated (a switch control step S300). A loop path is generated to connect the input pin and the output pin of the DUT 200 outside the pin electronics 12 (S302). By controlling the switching unit 20, S300 and S302 are performed simultaneously. Further, the loop path is a path including the deterministic jitter injecting unit 24.

Then, an output signal of a predetermined pattern is output to the DUT 200 (S304). In S304, a pattern of the output signal is determined according to an amount of a deterministic jitter which should be injected into the output signal. The deterministic jitter is injected into the output signal of the DUT 200 by the deterministic jitter injecting unit 24 on the loop path and the output signal is input to the input pin of the DUT 200 by feedback (a deterministic jitter injecting step S306). Then, pass/fail of the DUT 200 is determined (S308). For example, a jitter tolerance of the DUT 200 is measured by measuring the jitter of the output signal. The measurement in S308 may be performed by varying the amount of the deterministic jitter injected in S306.

Although the present invention has been described by way of exemplary embodiments, it should be understood that those skilled in the art might make many changes and substitutions without departing from the spirit and the scope of the present invention which is defined only by the appended claims.

For example, the main frame 10 may include a means for injecting a jitter into a test signal in case of performing a logic testing on the DUT 200. The main frame 10 may include a means for injecting a sinusoidal jitter and a random jitter into the test signal. Further, the means for injecting the sinusoidal jitter and the like may inject a sinusoidal jitter having a plurality of different frequency components into the test signal.

Further, although the main frame 10 outputs an output signal of a predetermined pattern to the DUT 200 in case of performing a loop-back testing (jitter testing) on the DUT, the main frame 10 may provide the input pin Rx of the DUT 200 with a test signal of a predetermined pattern. In this case, the main frame 10 may output a test signal into which a sinusoidal jitter is injected. In case of performing a loop-back testing (jitter testing) by using the test signal output from the main frame 10, the test signal is provided to the deterministic jitter injecting unit 24 from the second pin card 14-2 via the second switch 22-2. Then, the deterministic jitter injecting unit 24 injects a deterministic jitter into the test signal and provides the input pin of the DUT 200 with the test signal. By this kind of control, it is possible to perform a testing by injecting a sinusoidal jitter and a random jitter into the test signal input to the DUT 200 in addition to the deterministic jitter.

In this case, the second switch 22-2 includes further a function of determining whether or not the second pin card 14-2 and the deterministic jitter injecting unit 24 are connected and connects the second pin card 14-2 and the input end of the deterministic jitter injecting unit 24.

This kind of testing is useful for a testing on a communication device regulated in T11 test standard ("Fibre Channel—Methodologies for Jitter and Signal Quality Specification—MJSQ," National Committee for Information Technology Standardization (NCITS) T11.2/Project 1316-DT, Rev 6.0, 2002). The standard provides for using a sinusoidal jitter, a deterministic jitter, and a random jitter for a jitter tolerance testing.

As clear from the above description, according to the present invention, it is possible to perform accurately a loop-back testing for testing jitter tolerance of a DUT with a simple constitution. Further, it is possible to perform a testing on a DUT with multi-lane serial interface with a simple constitution.

What is claimed is:

1. A testing apparatus for performing a testing on a device under test (DUT) comprising:
   a performance board on which the DUT is mounted;
   a main frame for generating a test signal for testing the DUT and determining pass/fail of the DUT on the basis of an output signal output by the DUT;
   a pin electronics which is provided between said main frame and said performance board and performs sending and receiving signals between said main frame and the DUT;
   a deterministic jitter injecting unit for receiving the output signal without passing through said pin electronics and a comparator, and inputting a loop signal, which is the received output signal into which a deterministic jitter is injected, to an input pin of the DUT without passing through said pin electronics and a driver; and
   a switching unit for determining whether the input pin of the DUT is provided with the test signal output by said pin electronics or the loop signal output by said deterministic jitter injecting unit.

2. A testing apparatus as claimed in claim 1, wherein
   said pin electronics comprises a driver for outputting the test signal to the input pin of the DUT and a comparator for receiving the output signal from an output pin of the DUT, and
   said deterministic jitter injecting unit receives the output signal from the output pin without passing through said comparator of said pin electronics and inputs the loop signal to the input pin without passing through said driver of said pin electronics.

3. A testing apparatus as claimed in claim 1, wherein said pin electronics comprises
   a first pin card which corresponds to the input pin of the DUT and provides the input pin of the DUT with the test signal generated by said main frame; and
   a second pin card which corresponds to the output pin of the DUT and receives the output signal output by the DUT, and
   said switching unit further comprises,
   a first switching unit which corresponds to the input pin and determines whether the input pin is connected to said first pin card or said deterministic jitter injecting unit; and
   a second switching unit which corresponds to the output pin and determines whether the output pin is connected to said second pin card or said deterministic jitter injecting unit.

4. A testing apparatus as claimed in claim 3, wherein said switching unit and said deterministic jitter injecting unit are provided on a switch board provided between said performance board and said pin electronics.

5. A testing apparatus as claimed in claim 3, wherein said deterministic jitter injecting unit comprises a cable through which the output signal passes and which injects the deterministic jitter into the output signal.

6. A testing apparatus as claimed in claim 5, wherein said deterministic jitter injecting unit further comprises a limiting amplifier for removing an amplitude degrading component from the loop signal into which the deterministic jitter is injected and providing the input pin with the loop signal.

7. A testing apparatus as claimed in claim 5, further comprising a jitter amount control unit for controlling an amount of the deterministic jitter, which is injected into the output signal by said deterministic jitter injecting unit, by controlling the length of said cable through which the output signal passes.

8. A testing apparatus as claimed in claim 5, further comprising a jitter amount control unit for controlling an amount of the deterministic jitter, which is injected into the output signal by said deterministic jitter injecting unit, by controlling a response characteristic of a first-order filter.

9. A testing apparatus as claimed in claim 3, wherein said deterministic jitter injecting unit comprises a first-order filter through which the output signal passes and which injects the deterministic jitter into the output signal.

10. A testing apparatus as claimed in claim 9, wherein said deterministic jitter injecting unit further comprises a limiting amplifier for removing an amplitude degrading component from the loop signal into which the deterministic jitter is injected and providing the input pin with the loop signal.

11. A testing apparatus as claimed in claim 9, further comprising a jitter amount control unit for controlling an amount of the deterministic jitter, which is injected into the output signal by said deterministic jitter injecting unit, by controlling a response characteristic of said first-order filter.

12. A testing apparatus as claimed in claim 3, further comprising a jitter amount control unit for controlling an amount of the deterministic jitter, which is injected into the output signal by said deterministic jitter injecting unit, by controlling a pattern of the output signal output by the DUT.

13. A testing apparatus as claimed in claim 12, wherein said main frame provides the DUT with a control signal for outputting the output signal of a predetermined pattern to the DUT in case of performing the jitter testing.

14. A testing apparatus as claimed in claim 12, further comprising a jitter measuring unit for measuring a jitter of at least of the loop signal and the output signal in case of performing the jitter testing.

15. A testing apparatus as claimed in claim 3, further comprising a switch control unit for connecting the input pin and said first pin card to said first switch and the output pin and said second pin card to said second switch in case of performing a logic testing on the DUT, and connecting the input pin and said deterministic jitter injecting unit to said first switch and the output pin and said deterministic jitter injecting unit to said second switch in case of performing a jitter testing on the DUT.

16. A testing apparatus as claimed in claim 15, wherein said switch control unit controls said first switch via said first pin card and controls said second switch via said second pin card.

17. A testing apparatus as claimed in claim 1, further comprising a jitter measuring unit for measuring a jitter of at least of the loop signal and the output signal in case of performing the jitter testing.

18. A testing apparatus as claimed in claim 17, wherein said jitter measuring unit calculates a jitter injected by a signal transmission path other than said deterministic jitter injecting unit on the basis of a pattern of the output signal and corrects the measured jitter value.

19. A testing apparatus as claimed in claim 18, wherein means for injecting a sinusoidal jitter injects the sinusoidal jitter having a plurality of different frequency components into the test signal.

20. A testing apparatus as claimed in claim 1, wherein said main frame comprises a means for injecting a sinusoidal jitter into the test signal.

21. A testing method for performing a jitter testing on a device under test (DUT) by using a testing apparatus comprising a performance board on which the DUT is mounted; a main frame for generating a test signal for testing the DUT and determining pass/fail of the DUT on the basis of an output signal output by the DUT; a pin electronics which is provided between said main frame and said performance board and performs sending and receiving signals between said main frame and the DUT; and a switching unit for determining whether or not said pin electronics is connected to the DUT, comprising:
   a switch control step of making said switching unit disconnect said pin electronics and the DUT; and
   a deterministic jitter injecting step of receiving the output signal without passing through said pin electronics and a comparator, and inputting a loop signal, which is the received output signal into which a deterministic jitter is injected, to an input pin of the DUT without passing through said pin electronics and a driver.

* * * * *